(12) United States Patent
Chou

(10) Patent No.: US 7,137,803 B2
(45) Date of Patent: Nov. 21, 2006

(54) FLUID PRESSURE IMPRINT LITHOGRAPHY

(76) Inventor: Stephen Y. Chou, 7 Foulet Dr., Princeton, NJ (US) 08540

( * ) Notice: Subject to any disclaimer, the term of this patent is extended or adjusted under 35 U.S.C. 154(b) by 0 days.

(21) Appl. No.: 10/140,140

(22) Filed: May 7, 2002

(65) Prior Publication Data

US 2002/0132482 A1    Sep. 19, 2002

Related U.S. Application Data

(62) Division of application No. 09/618,174, filed on Jul. 18, 2000, now Pat. No. 6,482,742.

(51) Int. Cl.
*A01J 21/00* (2006.01)
(52) U.S. Cl. .............. 425/405.1; 425/405.2; 425/387.1; 425/389
(58) Field of Classification Search ............ 425/387.1, 425/388, 389, 405.1, 405.2, 143, 150; 264/293
See application file for complete search history.

(56) References Cited

U.S. PATENT DOCUMENTS

| | | | |
|---|---|---|---|
| 3,922,134 A * | 11/1975 | Kupfrian | 425/292 |
| 4,268,238 A | 5/1981 | Marc | 425/174.8 |
| 4,325,779 A | 4/1982 | Rossetti | 156/651 |
| 4,504,341 A | 3/1985 | Radzwill et al. | 156/102 |
| 4,642,255 A | 2/1987 | Dlubak | 428/38 |
| 4,731,155 A | 3/1988 | Napoli et al. | 156/643 |
| 4,747,896 A | 5/1988 | Anastasie | 156/85 |
| 5,234,717 A * | 8/1993 | Matsuno et al. | 427/277 |
| 5,234,756 A | 8/1993 | Kohama et al. | 428/284 |
| 5,370,760 A * | 12/1994 | Mori et al. | 156/89.16 |
| 5,405,667 A | 4/1995 | Heider | 428/36.5 |
| 5,427,599 A * | 6/1995 | Greschner et al. | 65/305 |
| 5,466,146 A * | 11/1995 | Fritz et al. | 425/389 |
| 5,643,522 A * | 7/1997 | Park | 264/313 |
| 5,648,109 A * | 7/1997 | Gutowski et al. | 425/504 |
| 5,772,905 A | 6/1998 | Chou | 216/44 |
| 5,863,452 A * | 1/1999 | Harshberger, Jr. et al. | 249/83 |
| 5,958,326 A | 9/1999 | Caferro | 264/550 |
| 6,045,927 A | 4/2000 | Nakanishi et al. | 428/614 |
| 6,099,940 A | 8/2000 | Hamilton et al. | 428/178 |
| 6,121,103 A | 9/2000 | Tully et al. | 438/381 |
| 6,159,400 A | 12/2000 | Laquer | 264/39 |
| 6,190,929 B1 | 2/2001 | Wang et al. | 438/20 |
| 6,197,245 B1 | 3/2001 | Usui et al. | 264/572 |
| 6,245,161 B1 | 6/2001 | Henley et al. | 148/33.4 |
| 6,319,745 B1 | 11/2001 | Bertin et al. | 438/60 |
| 6,365,059 B1 * | 4/2002 | Pechenik | 216/52 |
| 6,425,972 B1 | 7/2002 | McReynolds | 156/285 |
| 6,444,160 B1 * | 9/2002 | Bartoli | 264/545 |
| 6,533,986 B1 * | 3/2003 | Fosaaen et al. | 264/314 |

* cited by examiner

*Primary Examiner*—Joseph S. Del Sole
*Assistant Examiner*—Emmanuel S. Luk
(74) *Attorney, Agent, or Firm*—Polster, Lieder, Woodruff & Lucchesi, L.C.

(57) ABSTRACT

An improved method of imprint lithography involves using direct fluid pressure to press the mold into a substrate-supported film. Advantageously the mold and/or substrate are sufficiently flexible to provide wide area contact under the fluid pressure. Fluid pressing can be accomplished by sealing the mold against the film and disposing the resulting assembly in a pressurized chamber. It can also be accomplished by subjecting the mold to jets of pressurized fluid. The result of this fluid pressing is enhanced resolution and high uniformity over an enlarged area.

25 Claims, 6 Drawing Sheets

FLUID PRESSURE IMPRINT LITHOGRAPHY

This is a Divisional of U.S. application No. 09/618,174, filed Jul. 18, 2000, now U.S. Pat. No. 6,482,742, issued on Nov. 19, 2002.

FIELD OF THE INVENTION

This invention relates to imprint lithography and, in particular, to imprint lithography wherein direct fluid pressure is used to press a mold into a thin film. The process is particularly useful to provide nanoimprint lithography of enhanced resolution and uniformity over an increased area.

BACKGROUND OF THE INVENTION

Lithography is a key process in the fabrication of semiconductor integrated circuits and many optical, magnetic and micromechanical devices. Lithography creates a pattern on a thin film carried on a substrate so that, in subsequent process steps, the pattern can be replicated in the substrate or in another material which is added onto the substrate.

Conventional lithography typically involves applying a thin film of resist to a substrate, exposing the resist to a desired pattern of radiation, and developing the exposed film to produce a physical pattern. In this approach, resolution is limited by the wavelength of the radiation, and the equipment becomes increasingly expensive as the feature size becomes smaller.

Nanoimprint lithography, based on a fundamentally different principle offers high resolution, high throughput, low cost and the potential of large area coverage. In nanoimprint lithography, a mold with nanoscale features is pressed into a thin film, deforming the shape of the film according to the features of the mold and forming a relief pattern in the film. After the mold is removed, the thin film can be processed to remove the reduced thickness portions. This removal exposes the underlying substrate for further processing. Details of nanoimprint lithography are described in applicant's U.S. Pat. No. 5,772,905 issued Jun. 30, 1998 and entitled "Nanoimprint Lithography". The '905 patent is incorporated herein by reference.

The usual method of pressing the mold into the thin film involves positioning the mold and the substrate on respective rigid plates of a high precision mechanical press. With such apparatus, the process can generate sub-25 nm features with a high degree of uniformity over areas on the order of 12 in$^2$. Larger areas of uniformity would be highly advantageous to increase throughput and for many applications such as displays.

SUMMARY OF THE INVENTION

An improved method of imprint lithography involves using direct fluid pressure to press a mold into a substrate-supported film. Advantageously the mold and/or substrate are sufficiently flexible to provide wide area contact under the fluid pressure. Fluid pressing can be accomplished by sealing the mold against the film and disposing the resulting assembly in a pressurized chamber. It can also be accomplished by subjecting the mold to jets of pressurized fluid. The result of this fluid pressing is enhanced resolution and high uniformity over an enlarged area.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawing are for purposes of illustrating the concepts of the invention and are not to scale.

DETAILED DESCRIPTION

The use of a high precision mechanical press to press a mold into a thin film presents tolerance problems in replicating small patterns over large areas. Presses move on guide shafts through apertures, and the spacings between the shafts and their respective apertures can be large compared to the features to be replicated. Such spacings permit undesirable relative translational and rotational shifts between the substrate and the mold. Moreover, despite the most careful construction, the molds and the substrates used in lithography are not perfectly planar. When these molds and substrates are disposed on the rigid plates of a press, the deviations from planarity over large areas can result in variations in the molding pressure and depth of imprint. Accordingly, it is desirable to provide a method of imprint lithography which avoids the limitations of mechanical presses.

In accordance with the invention, the problem of unwanted lateral movements of mechanical presses is ameliorated by using direct fluid pressure to press together the mold and the moldable surface. The inventive methods apply fluid pressure over a surface of the mold, the substrate supporting the moldable surface or both. Because the fluid pressure is isostatic, no significant unbalanced lateral forces are applied. Direct fluid pressure also includes fluid pressure transmitted to the mold or substrate via a flexible membrane, as it does not interfere with the transmission of isostatic pressure from the fluid. And streaming pressurized fluid from numerous openings in a pressure vessel can also apply nearly isostatic direct fluid pressure on the mold or substrate.

It is contemplated that the invention will have important applications in the molding of a pattern on a previously patterned substrate. The mold can be aligned with the previous pattern using conventional alignment techniques, and imprinting by direct fluid pressure minimizes any relative lateral shifts with consequent improvement in the alignment of the two patterns.

Figure 1:
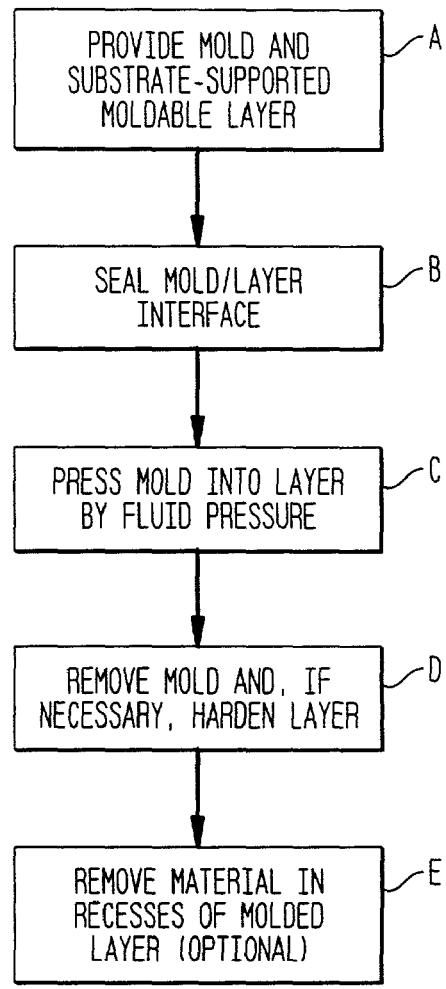
FIG. 1 is a schematic flow diagram of the steps in an improved method of imprint lithography.

Referring to the drawings, FIG. 1 is a schematic flow diagram of an improved process for imprint lithography using direct fluid pressure. An initial step shown in Block A, is to provide a mold having a plurality of protruding features and a substrate-supported thin film of moldable material. The protruding features are preferably micrometer scale features and, more advantageously, nanoscale features. The method is highly advantageously where the mold surface has at least two protruding features spaced apart by at least one lateral dimension less than 200 nm. A moldable material is one which retains or can be hardened to retain the imprint of protruding features from a mold surface.

Figure 2:
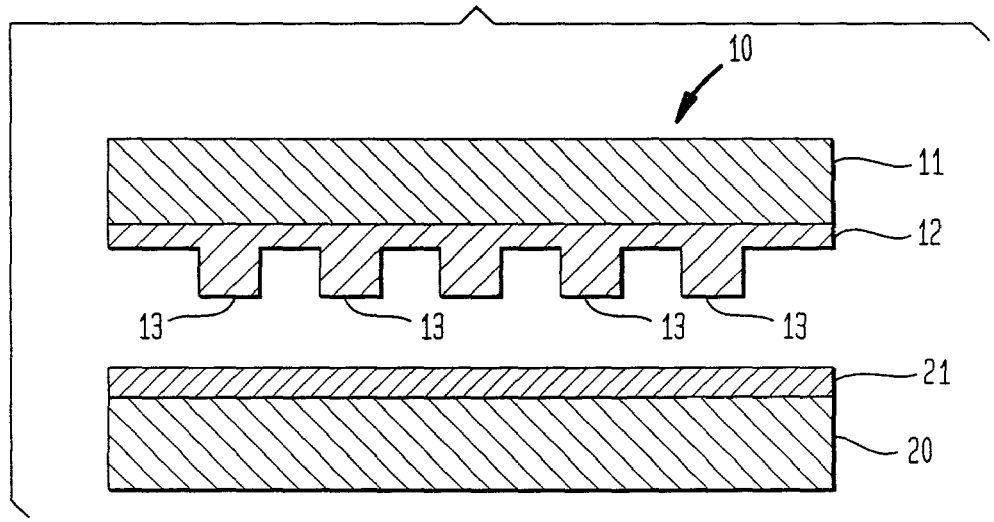
FIG. 2 illustrates a typical mold and a substrate bearing a moldable film for use in the improved method of FIG. 1.

FIG. 2 illustrates a typical mold 10 with protruding features and a substrate 20 bearing a moldable thin film 21 for use in the process of FIG. 1. The mold comprises a body 11 and a molding layer 12 including a plurality of protruding features 13 having a desired shape. The mold body 11 and the molding layer 12 are typically fused quartz, glass or ceramic. The molding layer 12 can be patterned into features 13 of nanoscale dimensions using electron beam lithography and etching techniques well known in the art. The thickness of layer 21 is typically in the range 0.1 nm–10 μm, and the extent of protruding features 13 is typically in the range 0.1 nm–10 μm.

The substrate typically comprises a semiconductor wafer such as a substantially planar wafer of monocrystalline silicon. The substrate could also be plastic, glass or ceramic. The moldable thin film 21 can be any polymer that can be made pliable to pressure and can retain a pressure-imprinted deformation or pattern. It can be a thermoplastic polymer, such as polycarbonate or polymethyl methacrylate (PMMA), which temporarily softens in response to heat. Alternatively it can be a liquid, such as a UV-curable silicone, which hardens in response to radiation or a liquid which cures with heat. It can also be a composite layer of polymer and hardenable liquid. The thin film is typically applied to the substrate by spraying or spinning. Advantageously the film polymer does not adhere to the mold surface. If necessary, the mold surface can be coated with a release agent to prevent such adherence.

In high resolution applications, the mold and the substrate are advantageously made of the same material in order to minimize misalignment due to differential thermal expansion or contraction.

Preferably the mold body 11, the substrate 20 (or both) is flexible so that, under the force of fluid pressure, the mold and the substrate will conform despite deviations from planarity. Silicon substrates of thickness less than 2 mm exhibit such flexibility for typical imprint pressures.

The next step, shown in Block B, is to place the mold and the thin-film together and to seal the interface of the mold with the thin film, forming a mold/film assembly. If the thin film already includes a previously formed pattern, then the pattern of the mold should be carefully aligned with the previous pattern on the film in accordance with techniques well known in the art. The objective of the sealing is to permit external fluid pressure to press the mold into the film. The sealing can be effected in a variety of ways such as by providing a ring of material such as an elastomeric gasket around the area to be molded and peripherally clamping the assembly.

The third step (Block C) is to press the mold into the film by direct fluid pressure. One method for doing this is to dispose the assembly in a pressure vessel and introduce pressurized fluid into the vessel. The advantage of fluid pressure is that it is isostatic. The resulting force uniformly pushes the mold into the thin film. Shear or rotational components are de minimus. Moreover since the mold and/or substrate are flexible rather than rigid, conformation between the mold and the film is achieved regardless of unavoidable deviations from planarity. The result is an enhanced level of molding resolution, alignment and uniformity over an increased area of the film.

The pressurized fluid can be gas or liquid. Pressurized air is convenient and typical pressures are in the range 1–1000 psi. The fluid can be heated, if desired, to assist in heating the moldable thin film. Cooled fluid can be used to cool the film.

Figure 3:
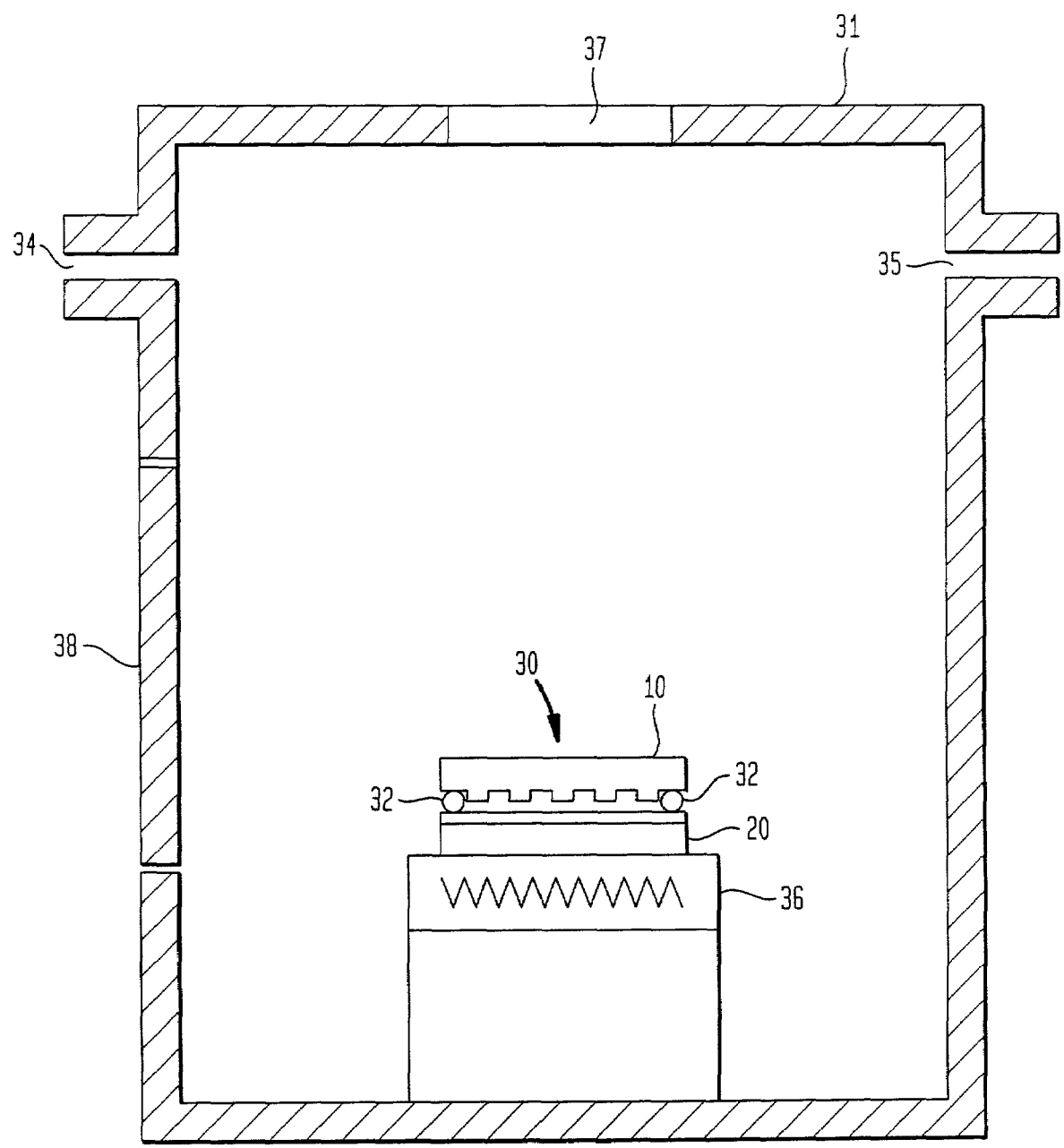
FIG. 3 illustrates apparatus for practicing the improved method of FIG. 1.

FIG. 3 illustrates a sealed mold/film assembly 30 disposed within a pressure vessel 31. The assembly 30 is sealed by a peripheral elastomeric gasket 32, extending around the area to be molded. The periphery of the assembly can be lightly clamped by a clamp (not shown) to effectuate the seal. The vessel 31 preferably includes a valve-controlled inlet 34 for the introduction of pressurized fluid and a valve controlled outlet 35 for the exit of such fluid. The vessel 31 may optionally include a heater 36 for heating a thermoplastic or heat curable thin film and/or a transparent window 37 for introducing radiation to cure or cross link the film. A sealable door 38 can provide access to the interior of the vessel.

The next step shown in Block D, is to harden the moldable thin film, if necessary, so that it retains the imprint of the mold and to remove the mold. The process for hardening depends on the material of the thin film. Some materials will maintain the imprint with no hardening. Thermoplastic materials can be hardened by preliminarily heating them prior to molding and permitting them to cool after imprint. PMMA, for example, can be suitably softened by heating to 200° C. prior to molding and hardened by cooling after imprint. Heat curable materials can be hardened by applying heat during imprint. The above-described heater 36 and/or the use of a heated pressurized fluid can effectuate such hardening. Radiation curable materials can be hardened by the application of UV radiation during imprint. Such radiation can be supplied through the window 37 of the pressure vessel. The mold can be made of transparent material to permit the radiation to reach the film. Alternatively, the substrate can be transparent and the window positioned to illuminate the film through the substrate.

The fifth step shown in Block E is optional in some applications. It is to remove contaminants (if any) and excess material from the recesses of the molded thin film. The molded film will have raised features and recesses. In many lithographic operations it is desirable to eliminate the material from the recesses so that the underlying substrate is exposed for further processing. This can be conveniently accomplished using reactive ion etching.

Figure 4A:
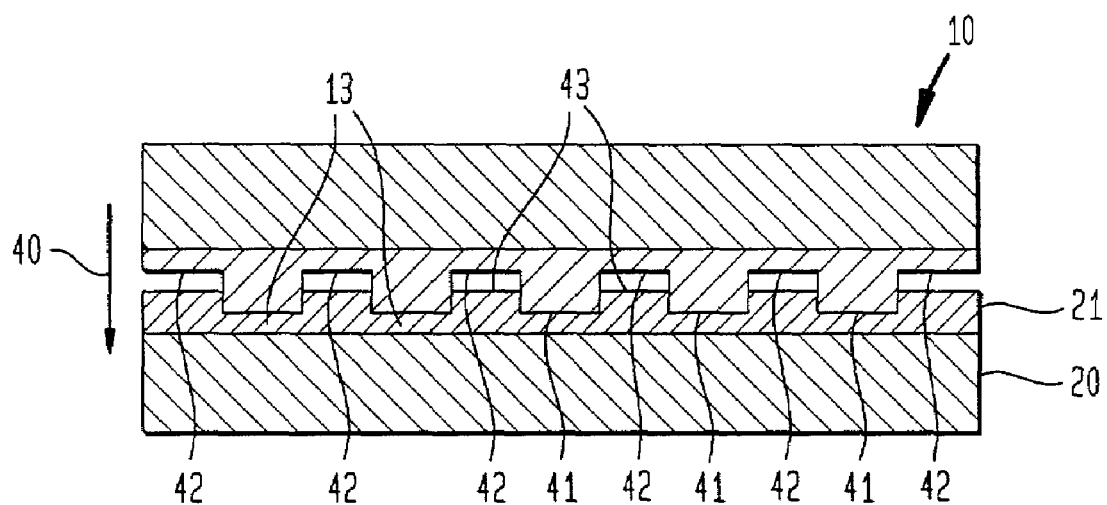
FIGS. 4A, 4B and 4C show the moldable layer and substrate at various stages of the process of FIG. 1.
Figure 4B:
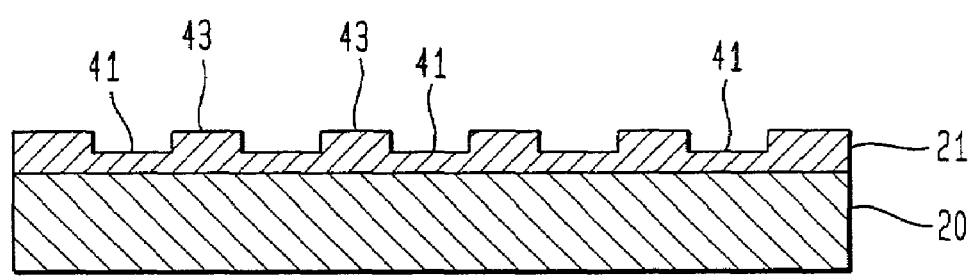
Figure 4C:
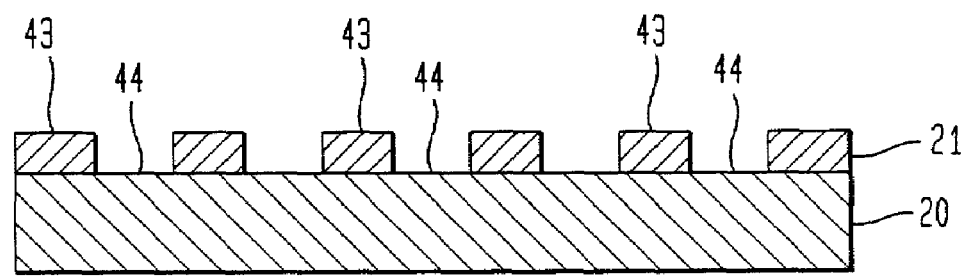

FIGS. 4A, 4B and 4C show the moldable layer and substrate at various stages of the process. FIG. 4A illustrates the layer 21 during imprinting by mold 10 pressed by fluid pressure in the direction of arrow 40. The protruding features 13 of the mold press into layer 21, producing thinned regions 41. The recessed regions 42 of the mold between successive protruding features leave layer 21 with regions 43 of greater thickness.

FIG. 4B shows the layer 21 after hardening and removal of the mold. The layer 21 retains the thinned regions 41 and thick regions 43 in accordance with the pattern imprinted by the mold.

FIG. 4C illustrates the layer and substrate after removal of the excess layer material in the recesses, exposing nanoscale regions 44 of the substrate 20.

In important applications the resulting structure is a resist-covered semiconductor substrate with a pattern of recesses extending to the substrate as shown in FIG. 4C. Such a structure can be further processed in a variety of ways well-known in the art. For example, the molded film can be used as a mask for the removal of surface layers in exposed regions of the substrate, for doping exposed regions or for growing or depositing materials on the exposed regions.

Figure 5A:
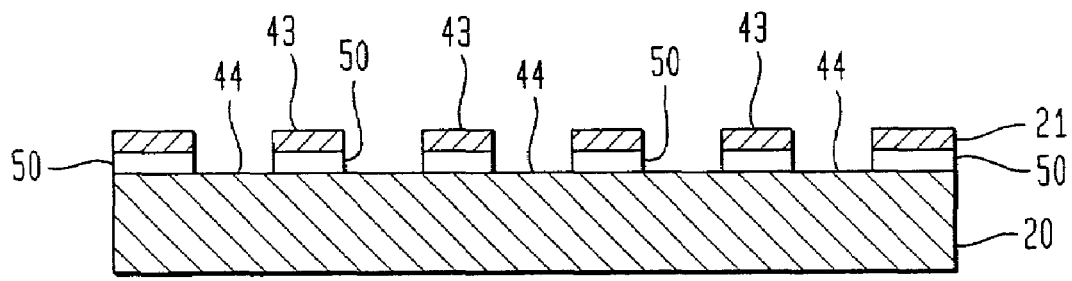
FIGS. 5A, 5B and 5C illustrate various further processing steps that can be performed on the substrate.
Figure 5B:
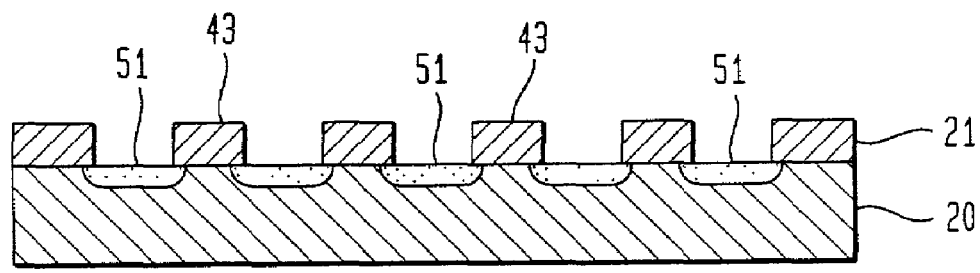
Figure 5C:
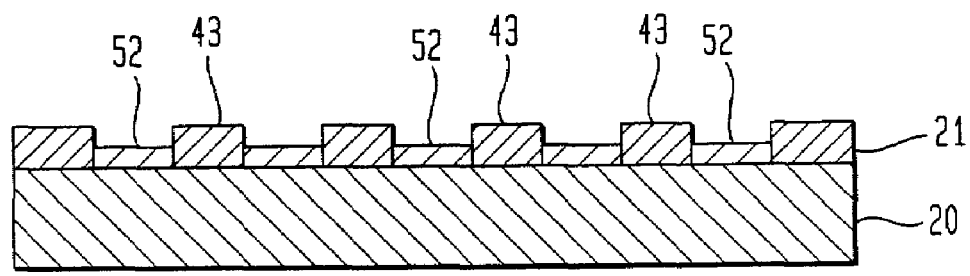

FIGS. 5A, 5B and 5C illustrate such further processing. In FIG. 5A, the substrate can include a surface dielectric layer 50 (such as SiO$_2$ on Si) and the mask layer can permit removal of the dielectric at exposed regions. In FIG. 5B impurity regions 51 can be diffused or implanted into the semiconductor selectively in those regions which are exposed, altering the local electrical or optical properties of the doped regions. Alternatively, as shown in FIG. 5C new material layers 52 such as conductors or epitaxial layers can be deposited or grown on the exposed substrate within the recesses. After processing, the remaining material of the molded layer can be removed, if desired, using conventional techniques. PMMA, for example, can be cleaned away by washing with acetone. A substrate can be subjected to additional lithographic steps to complete a complex device such as an integrated circuit.

As mentioned above, there are a variety of ways of sealing the mold/film assembly 30 so that pressurized fluid will press the mold into the film. FIGS. 6A–6D illustrate several of these ways.

Figure 6A:
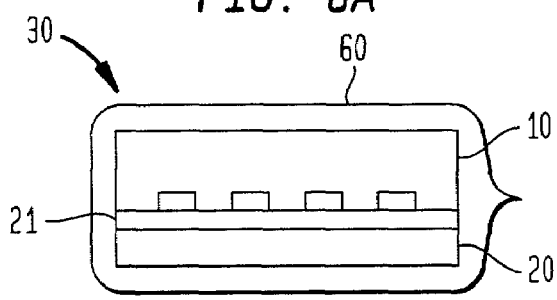
FIGS. 6A–6E illustrate alternative sealing arrangements useful in the method of FIG. 1.

FIG. 6A schematically illustrates an arrangement for sealing a mold/film assembly by disposing the assembly within a sealed covering of flexible, fluid-impermeable membrane 40 (e.g. a plastic bag). In this arrangement the region between the mold and the moldable layer is sealed in relation to an external pressure vessel. Preferably the air is removed from the bag before molding.

Figure 6B:
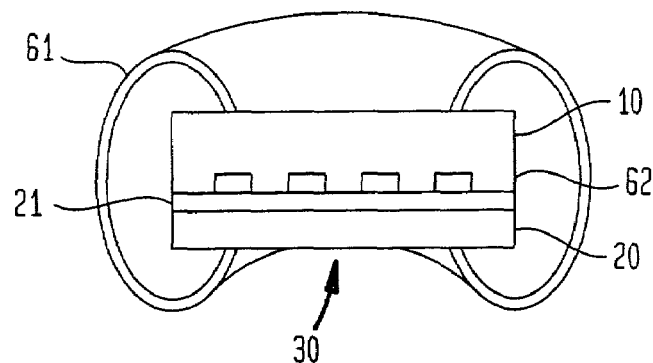

FIG. 6B shows an alternate sealing arrangement wherein the assembly 30 is sealed by a peripheral sealing clamp 61 which can be in the form of a hollow elastic torroid. Sealing can be assisted by providing the mold with a protruding region 62 extending around the region to be molded. In use, the clamp and pressurized fluid will press the protruding region 62 into the moldable film, sealing the molding region.

Figure 6C:
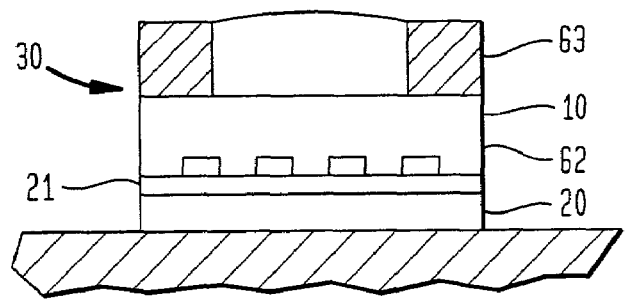

FIG. 6C illustrates a sealing arrangement in which the assembly 30 is sealed by applying a peripheral tube or weight 63 which lightly presses the mold onto the moldable film. A peripheral protruding region 62 can assist sealing.

Figure 6D:
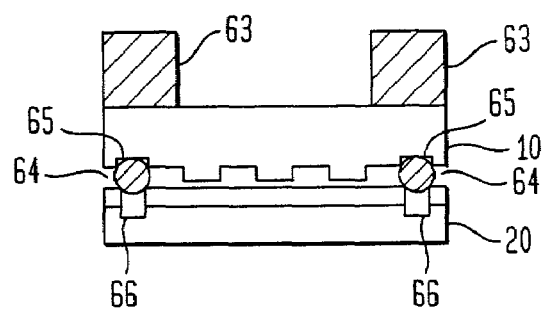

FIG. 6D shows an alternative sealing arrangement wherein the assembly 30 is sealed by a sealing o-ring 64 between the mold and the substrate. Preferably the o-ring seats within peripheral recesses 65, 66 in the mold and the substrate, respectively. Light pressure from a peripheral tube or weight 63 can assist sealing.

Figure 6E:
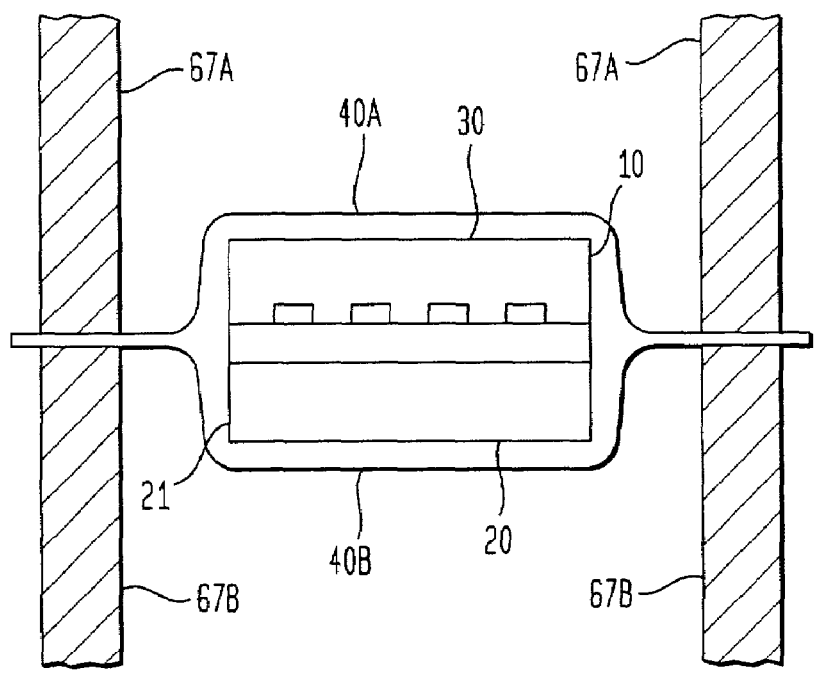

FIG. 6E shows yet another sealing arrangement in which the assembly 30 is disposed between flexible membranes 40A and 40B is enclosed within a pair of mating cylinders 67A, 67B. Application of fluid pressure to the interior of the cylinders would press the mold and moldable surface together.

Alternatively, two the cylinders could lightly seal against the mold and the substrate, respectively, before pressurization. Yet further in the alternative, the substrate could rest upon a support and a single cylinder lightly seal against the mold or a membrane.

Figure 7:
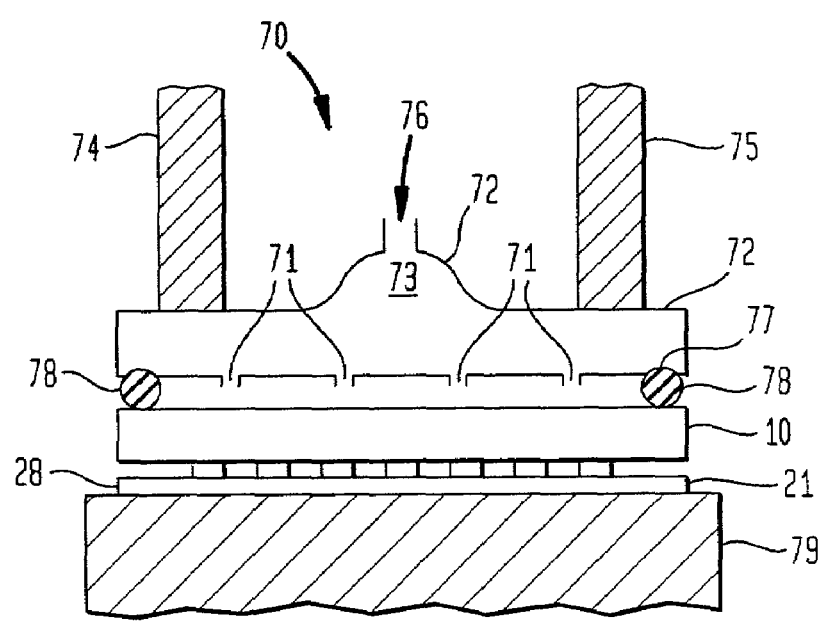
FIG. 7 shows alternative apparatus for practicing the method of FIG. 1.

FIG. 7 illustrates alternative molding apparatus 70 where the assembly is disposed adjacent openings 71 in a hollow pressure cap 72 and the mold 10 is pressed into the moldable layer 21 by jets of pressurized fluid escaping through the openings 71. The cap 72 (analogous to vessel 31) has an internal chamber 73 for pressurized fluid. The region between the mold and the moldable film is effectively sealed from the pressure vessel by the upper surface of the mold.

In operation, the substrate and mold are placed on a substrate holder 79. The cap 72 can be held in fixed position above the mold 10, as by bars 74, 75. High pressure fluid, preferably gas, is pumped into chamber 73 through an inlet 76. The high pressure fluid within the chamber produces a fluid jet from each opening 71. These jets uniformly press the mold 10 against the moldable layer to imprint the mold features.

Advantageously, the cap 72 can include a groove 77 along a perimeter of the face adjacent the mold 10. The groove 77 can hold an o-ring 78 between the cap 72 and the mold 20. The o-ring decreases fluid outflow between the cap 72 and the mold 10, increasing the molding pressure and making it more uniform.

Alternatively, the substrate holder 79 can have the same structure as cap 72 so that the substrate is also pressed by jets of pressurized fluid.

EXAMPLES

The invention may now be better understood by consideration of the following specific examples.

Example 1

A silicon wafer of 4" diameter is coated with a layer of PMMA 150 nm thick. A mold is made of a 4" diameter silicon wafer and has plural silicon dioxide protruding patterns 100 nm thick on one side of its surface. The mold is placed on the PMMA layer with the protruding patterns facing the PMMA. The mold and the substrate are sealed in a plastic bag within a chamber, and the chamber is evacuated. Then nitrogen gas at 500 psi is introduced in the chamber. A heater in the chamber heats the PMMA to 170° C., which is above the glass transition temperature of the PMMA, softening the PMMA. Under the gas pressure, the mold is pressed into the PMMA. After turning off the heater and introducing a cold nitrogen gas, the PMMA temperature drops below its glass transition temperature, and the PMMA hardens. Then the nitrogen gas is vented to the atmosphere pressure. The mold and substrate assembly is removed from the chamber. The bag is cut off, and the mold is separated from the substrate.

Example 2

A silicon wafer of 4" diameter is coated with a layer of PMMA 150 nm thick and is placed on a chuck. The chuck has a plurality of small holes on its surface. The holes can be connected either to vacuum or to pressurized gas. When the holes are connected to vacuum, the chuck holds the wafer on the chuck's surface. A mold made of a 4" diameter silicon wafer has a plurality of silicon dioxide protruding patterns (100 nm thick) on one of its surfaces. The mold is held by a second chuck, which has the same design as the substrate chuck. The mold is placed on top of the PMMA layer with the protruding patterns facing the PMMA. The mold and the substrate are placed in a chamber. The PMMA can be heated from the chuck.

During the imprint process, the PMMA is first heated above its glass transition temperature. A ring pattern on the mold seals off the mold pattern inside the ring from the pressure outside. Then the holes of both chucks are changed from vacuum to a gas pressure of 500 psi. The pressurized gas presses the mold protruding patterns into PMMA. Importantly, the pressurized gas presses the mold protruding pattern into the PMMA uniformly in submicron scale, despite the roughness of the backsides of the mold and the substrate as well as the roughness of the chuck surfaces.

It is to be understood that the above described embodiments are illustrative of only a few of the many embodiments which can represent applications of the invention. Numerous and varied other arrangements can be made by those skilled in the art without departing from the spirit and scope of the invention.

What is claimed:

1. Apparatus for processing a substrate comprising:
   a moldable layer disposed on a surface of the substrate;
   a mold with a molding surface comprising a pattern having a plurality of protruding features disposed adjacent the moldable layer wherein at least two of the protruding features are spaced apart less than 200 nanometers; and
   a seal for sealing a region between the moldable layer and the molding surface from the pressurized fluid; and
   a pressure vessel containing pressurized fluid for supplying pressurized fluid to isostatically press together the molding surface and the moldable layer thereby imprinting the pattern in the moldable layer.

2. Apparatus according to claim 1 wherein the seal comprises a device selected from a peripheral gasket, an o-ring, a fluid impermeable flexible membrane, and a peripheral clamp.

3. Apparatus according to claim 1 wherein the substrate and mold are disposed within the pressure vessel.

4. Apparatus according to claim 3 wherein the pressure vessel further comprises a heater for heating the moldable layer.

5. Apparatus according to claim 3 wherein the pressure vessel further comprises a transparent window for permitting illumination of the moldable layer with radiation.

6. Apparatus according to claim 5 wherein the mold or the substrate is transparent to the radiation.

7. Apparatus according to claim 1 wherein the pressure vessel includes a plurality of openings for providing pressurized fluid to press together the mold and the moldable layer.

8. Apparatus according to claim 1 wherein the protruding features of the molding surface protrude by 0.1 nm to 10 μm.

9. A pressure molding system comprising:
   a pressure chamber;
   a mold having a face with a pattern comprising features of at least two heights, the features configured to imprint a pattern with a feature dimension smaller than 200 nm; and
   a substrate including a moldable layer located adjacent the face of the mold, a sealing device positioned to isolate a region between the mold and the substrate from pressure in the chamber, a portion of the mold or the substrate being exposed to fluid pressure of the chamber for isostatically pressing together the mold and the moldable layer thereby imprinting the pattern in the moldable layer.

10. The system of claim 9 wherein the pressure chamber includes an opening and the mold or the substrate is exposed to pressurized fluid from the opening.

11. The system of claim 9 wherein the sealing device comprises a ring of material positioned between the mold and the substrate.

12. The system of claim 11 wherein the ring is en o-ring.

13. The system of claim 9 wherein the sealing device comprises a flexible membrane.

14. The system of claim 9 wherein the sealing device comprises a clamp for peripherally clamping the mold to the substrate.

15. The system of claim 9 wherein the sealing device comprises at least one cylinder for sealing the mold, the substrate or flexible membrane.

16. The system of claim 9 wherein the pressure chamber comprises a plurality of openings for directing pressurized fluid towards the mold or the substrate.

17. The system of claim 16 wherein the fluid is directed toward a surface of the mold not adjacent to the substrate.

18. Apparatus for processing a substrate comprising:
    a moldable layer disposed on a surface of the substrate;
    a mold with a molding surface comprising a pattern having a plurality of protruding features disposed adjacent the moldable layer;
    a seal for sealing a region between the moldable layer and the molding surface from the pressurized fluid; and
    a pressure vessel containing pressurized fluid for supplying pressurized fluid to isostatically press together the molding surface and the moldable layer thereby imprinting the pattern in the moldable layer to form a pattern having microscale or nanoscale features.

19. Apparatus according to claim 18 wherein the seal comprises a device selected from a peripheral gasket, an o-ring, a fluid impermeable flexible membrane, and a peripheral clamp.

20. Apparatus according to claim 18 wherein the substrate and mold are disposed within the pressure vessel.

21. Apparatus according to claim 20 wherein the pressure vessel further comprises a heater for heating the moldable layer.

22. Apparatus according to claim 20 wherein the pressure vessel further comprises a transparent window for permitting illumination of the moldable layer with radiation.

23. Apparatus according to claim 22 wherein the mold or the substrate is transparent to the radiation.

24. Apparatus according to claim 18 wherein the pressure vessel includes a plurality of openings for providing pressurized fluid to press together the mold and the moldable layer.

25. Apparatus according to claim 18 wherein the substrate is disposed on a supporting surface.

* * * * *